(12) United States Patent
York

(10) Patent No.: US 12,334,673 B2
(45) Date of Patent: Jun. 17, 2025

(54) HAZARDOUS ENVIRONMENT ELECTRICAL FEEDBACK BARRIER DEVICE, ASSEMBLY, SYSTEM AND METHOD

(71) Applicant: Eaton Intelligent Power Limited, Dublin (IE)

(72) Inventor: Paul R. York, Ellalong (AU)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 18/638,338

(22) Filed: Apr. 17, 2024

(65) Prior Publication Data

US 2024/0283193 A1    Aug. 22, 2024

Related U.S. Application Data

(62) Division of application No. 16/785,264, filed on Feb. 7, 2020, now Pat. No. 11,978,980.

(Continued)

(51) Int. Cl.
*H01L 29/866* (2006.01)
*H01L 29/872* (2006.01)
(Continued)

(52) U.S. Cl.
CPC ......... *H01R 13/527* (2013.01); *H01R 13/533* (2013.01); *H02B 1/16* (2013.01);
(Continued)

(58) Field of Classification Search
CPC ... H01L 29/866; H01L 29/872; H01R 13/527; H01R 13/533; H02B 1/16; H02H 9/008;
(Continued)

(56) References Cited

U.S. PATENT DOCUMENTS 3,813,578 A    5/1974  Tiffany
5,014,156 A    5/1991  Bruch et al.
(Continued)

FOREIGN PATENT DOCUMENTS

CN    2020696692 U1    1/2013
CN    203883526    10/2014
(Continued)

OTHER PUBLICATIONS

Extended European Search Report for Application No. 20157279.9; Jul. 10, 2020; 8 pages.
(Continued)

*Primary Examiner* — Timothy J Thompson
*Assistant Examiner* — Guillermo J Egoavil
(74) *Attorney, Agent, or Firm* — Merchant & Gould P.C.

(57) ABSTRACT

An electrical feedback barrier is configured to safely interconnect an intrinsically safe power supply to a non-intrinsically safe electrical load device in a hazardous environment. Electrical feedback from the non-intrinsically electrical load device is blocked by the electrical feedback barrier to protect the intrinsically safe power supply from adverse operating conditions. The electrical feedback barrier and the electrical load device are enclosed in an explosion-proof or flameproof enclosure for compliance with electrical equipment safety standards in the hazardous environment.

15 Claims, 4 Drawing Sheets

Related U.S. Application Data

(60) Provisional application No. 62/805,790, filed on Feb. 14, 2019.

(51) Int. Cl.
*H01R 13/527* (2006.01)
*H01R 13/533* (2006.01)
*H02B 1/16* (2006.01)
*H04N 7/18* (2006.01)
*H10D 8/25* (2025.01)
*H10D 8/60* (2025.01)

(52) U.S. Cl.
CPC .................. *H04N 7/18* (2013.01); *H10D 8/25* (2025.01); *H10D 8/60* (2025.01)

(58) Field of Classification Search
CPC ........ H02H 1/04; H02H 5/047; H02H 7/1213; H02H 9/02; H02H 9/04; H02H 9/043; H02M 1/32; H02M 1/325; H02M 3/24; H04N 7/18
USPC ....................................................... 361/1, 56
See application file for complete search history.

(56) References Cited

U.S. PATENT DOCUMENTS

| | | | | |
|---|---|---|---|---|
| 6,381,114 | B1 * | 4/2002 | Mansfield | .............. H02H 9/008 361/58 |
| 6,404,609 | B1 * | 6/2002 | Mansfield | ............ H04B 10/802 361/103 |
| 6,424,028 | B1 | 7/2002 | Dickinson | |
| 6,456,057 | B1 * | 9/2002 | Weber | .................. G01F 15/024 324/120 |
| 7,463,470 | B2 | 12/2008 | Lark | |
| 8,848,332 | B2 | 9/2014 | Schmidt | |
| 2007/0183108 | A1 | 8/2007 | Uhlenberg et al. | |
| 2013/0043970 | A1 * | 2/2013 | Poddar | ................... H01F 27/36 336/84 C |
| 2015/0014538 | A1 | 1/2015 | Holliday | |
| 2016/0248241 | A1 * | 8/2016 | Kancel | ................... H02H 9/043 |

FOREIGN PATENT DOCUMENTS

| | | |
|---|---|---|
| CN | 207535838 | 10/2014 |
| CN | 207353838 U | 5/2018 |
| CN | 109039077 A | 12/2018 |
| CN | 109088404 A1 | 12/2018 |
| DE | 10049071 A1 | 4/2002 |
| DE | 102009023801 A1 | 2/2010 |
| DE | 202010004061 U1 | 6/2010 |
| GB | 1533680 | 2/1977 |
| GB | 2489101 A | 9/2012 |

OTHER PUBLICATIONS

Instrinsic Safety Ckt Design from Omega_Barbiarz_pp. Z-131 to Z-148_Seo 2018.

NEC Hazardous_Bussell et al._ pp. 1-13 & Appendix A-E_May 1996.

* cited by examiner

HAZARDOUS ENVIRONMENT ELECTRICAL FEEDBACK BARRIER DEVICE, ASSEMBLY, SYSTEM AND METHOD

CROSS-REFERENCE TO RELATED APPLICATIONS

This application is a division of U.S. patent application Ser. No. 16/785,264 filed Feb. 7, 2020, which claims the benefit of U.S. Provisional Patent Application Ser. No. 62/805,790 filed Feb. 14, 2019, the complete disclosure of each is hereby incorporated by reference in its entirety.

BACKGROUND OF THE INVENTION

The field of the invention relates generally to energy limiting barrier devices for an electrical power system operating in a hazardous environment, and more specifically to an electrical feedback barrier protecting an intrinsically safe power supply when powering a remote, non-intrinsically safe electrical load within an explosion-proof or flameproof enclosure.

Electrical power systems sometimes operate within hazardous environments presenting a risk of explosion via ignition of a surrounding gas or vapor dusts, fibers, or flyings. To address such risk, intrinsically safe power supply devices and intrinsically safe load devices have been developed that limit thermal and electrical energy in the operation of the power supply device to avoid ignition concerns. Available intrinsically safe devices are effective to ensure safe operation in a hazardous environment, but they are costly and impractical for certain applications and for certain types of low power consumption devices.

An alternative approach to managing ignition risks for an operating electrical power system in a hazardous environment is to utilize Explosion-Proof and Dust-Ignition-Proof (Ex d) Electrical Equipment that is designed to be capable of containing an internal explosion of a specified flammable vapor-air mixture, while operating at a safe temperature with respect to the surrounding atmosphere. Explosion-Proof and Dust-Ignition-Proof enclosures are available to enclose or contain load-side electrical devices that are not themselves intrinsically safe, and in such conditions the substantially higher cost of obtaining intrinsically safe load-side electrical devices would desirably be saved. Such cost savings depend on compatible power supplies to power the non-intrinsically safe electrical load devices, but in some cases compatible power supplies are not available on site. Especially for low power consumption devices, the cost and inconvenience of providing alternative power supplies and cabling to power them is a disincentive to adoption of non-intrinsically safe electrical loads.

Economical solutions to power low power consumption, non-intrinsically safe devices while remaining compliant with applicable standards for hazardous environments are therefore elusive in certain types of existing electrical power systems. Improvements are accordingly desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION OF THE INVENTION

Figure 1:
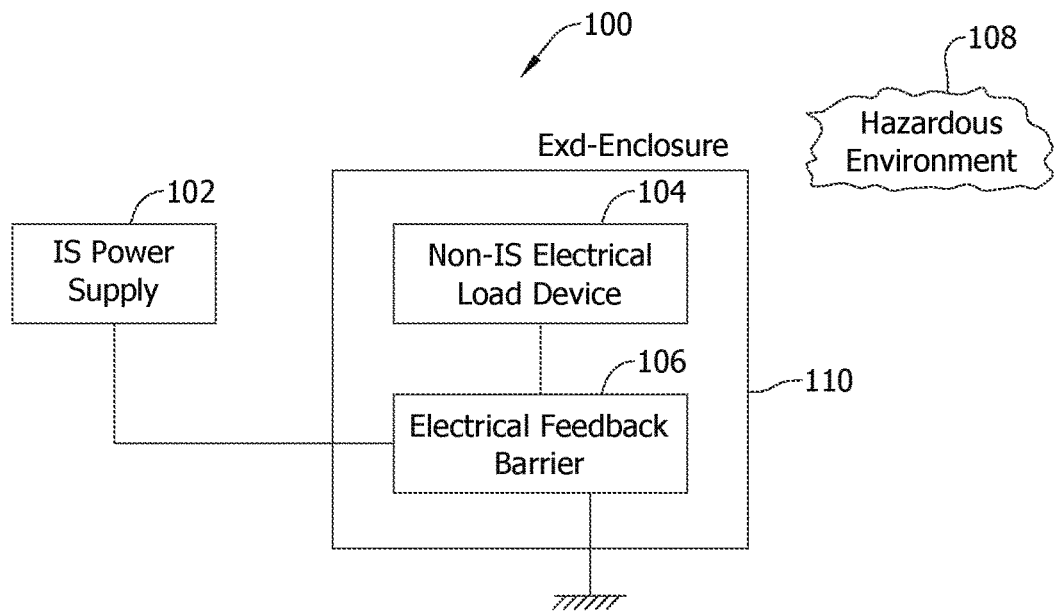
FIG. 1 is a first block diagram of an electrical power system including an electrical feedback barrier according to an exemplary embodiment of the invention.

In order to understand the inventive concepts described herein to their fullest extent, some discussion of the state of the art and certain problems and disadvantages therein is set forth below, followed by exemplary embodiments of devices, assemblies, systems and methods overcoming such problems and disadvantages.

Separate criteria and standards have been developed for intrinsically safe devices and Explosion-Proof and Dust-Ignition-Proof Electrical Equipment. In general, devices that are certified as being compliant with intrinsically safe (IS) standards include or are connected to a power supply including thermal and electrical energy limiting features in the output to a load device, as well as energy limiting features in the circuitry of the load-side device connected to the power supply output of an IS power supply. The thermal and electrical energy limiting features operate to regulate and manage an output voltage and current flow in the operation of the device to a safe level for the ambient, hazardous environment wherein the thermal and electrical energy is maintained at levels that are insufficient to present ignition concerns in an otherwise combustible environment that that include surrounding gas or vapor dusts, fibers, or flyings. Such intrinsically safe devices are rather sophisticated and costly, and in some instances the costs of intrinsically safe devices may be desirably avoided.

For example, considering low power consumption devices such as closed-circuit television (CCTV) camera devices that may be desirably used in large numbers in different locations throughout a hazardous environment of an industrial facility, significant cost savings may result if non-intrinsically safe CCTV camera devices and sensors could be utilized rather than substantially more expensive intrinsically safe CCTV camera devices. The cost of an intrinsically safe CCTV camera device may be more than four times the cost of a non-intrinsically safe CCTV camera device, however, so multiplied by a number of CCTV camera devices that are desirably utilized substantial cost savings may result if non-intrinsically safe CCTV camera devices could be used instead of intrinsically safe ones.

In certain applications such as longwall mining, however, intrinsically safe power supplies are preferred and therefore typically in use on site, but intrinsically safe power supplies generally cannot be used with non-intrinsically safe CCTV camera devices due to unsafe operating conditions that may result. Specifically, the non-intrinsically safe CCTV camera device may include inductive and/or capacitive components, which may in some instances return thermal and electrical energy back to the intrinsically safe power supply as undesirable electrical feedback. Such electrical feedback when presented in part compromises, if not defeats the energy limiting design of the intrinsically safe power supply and may create unsafe operating conditions. If installation of a lower cost, non-intrinsically safe CCTV camera device is desirable in the longwall mining application, an alternative power supply is therefore needed, but such power supplies may be limited or unavailable on site. The costs and inconvenience of providing alternative power supplies for a number of low power consumption, non-intrinsically safe CCTV camera devices at various different locations presents substantial burdens to electrical power system operators and imposes practical limitations on adoption and use of non-intrinsically safe CCTV cameras to realize cost savings in installing and maintaining a CCTV camera system.

Exemplary embodiments of devices, assemblies, systems and methods are described below that advantageously allow an intrinsically safe power supply to power a non-intrinsically safe electrical load device in a hazardous environment while still complying with applicable safety standards. This is achieved via a load-side electrical feedback barrier that is configured to protect an intrinsically safe power supply from electrical feedback when powering a remote, non-intrinsically safe electrical load within an explosion-proof or flameproof enclosure while being fully compliant with hazardous environment standards. Substantial cost savings are therefore possible via powering low power consumption, non-intrinsically safe electrical load devices from existing intrinsically safe power supplies at an installation site, without compromising safety.

Advantageously, the inventive devices, assemblies, systems and methods advantageously facilitate powering of low power consumption, non-intrinsically safe electrical load devices in a hazardous environment by intrinsically safe power supplies that are already present in the electrical power system, while avoiding any need for an alternate, non-intrinsically safe power supply that may not be present or may be impractical to provide. Particular benefits may accrue to a longwall mining application wherein intrinsically safe power supplies are preferred, wherein a surplus of intrinsically safe power supplies tends to exist, and where non-intrinsically safe power supplies are limited or not available to economically accommodate low power consumption devices such as CCTV camera devices.

While described below in reference to particular applications and particular devices, such description is intended for the sake of illustration rather than limitation. As such, it is understood that the benefit of the invention is not limited to a particular application (e.g., a mining application) or to particular types of load devices (e.g., CCTV camera devices). Rather, the inventive concepts broadly accrue to electrical power systems residing in any type of hazardous environment falling within the applicable definitions of the International Electrotechnical Commission (IEC), the National Electric Code (NEC), Underwriter's Laboratories (UL) or other standard or certification authority for electrical equipment designed for safe use in hazardous environments. In addition to the longwall mining application mentioned above, hazardous environments may also arise, for example only, in petroleum refineries, petrochemical plants, grain silos, waste water and/or treatment facilities among other industrial facilities, in which sustained or volatile conditions in the ambient environment may be present and may present a heightened risk of fire or explosion.

Likewise, the inventive concepts are not limited to CCTV camera devices, but instead broadly accrue to sensor devices, monitoring and instrumentation devices, and other similarly situated low power consumption load devices that may be desirably powered by intrinsically safe power supplies in a manner that is compliant with applicable hazardous environment safety standards.

In one aspect, an inventive electrical feedback barrier is provided that is configured to safely interconnect an intrinsically safe power supply to an electrical load device that is not an intrinsically safe device and that does not include its own power supply in a hazardous environment. The electrical feedback barrier includes an input and a first lead wire that connects to the intrinsically safe power supply, an output and a second lead wire that connects to the electrical load device, and at least a third lead wire that connects to electrical ground. In normal operation, the electrical feedback barrier passes through the voltage from the intrinsically safe power supply to the electrical load device. If electrical feedback occurs from capacitive or inductive elements in the electrical load device to the output of the electrical feedback barrier, the electrical feedback barrier provides a shunt current path to ground for the electrical feedback such that the electrical feedback does not reach the input side of the electrical feedback barrier where it could otherwise impact the operation of the intrinsically safe power supply. The electrical feedback barrier may include a plurality of diodes operative to isolate electrical feedback from the intrinsically safe power supply. The diodes may include Zener diodes, Schottky diodes, other equivalent semiconductor components, or other components capable of similar function.

In another aspect, an inventive electrical feedback barrier is provided that includes a circuit board and a feedback barrier circuit on the circuit board. The circuit board may include an input, an output and number of diodes connected between the input and the output. The diodes may include a series-connected pair of diodes and a pair of parallel-connected diodes connected between the input and the output. The pairs of diodes provide adequate redundancy for hazardous environment compliance. The series-connected pair of diodes conduct current in a forward direction from the input to the output, while the parallel-connected pair of diodes connect to electrical ground and in normal operation do not conduct any current. The parallel-connected diodes respond to an increased voltage at the output that is produced by electrical feedback from a connected non-intrinsically safe device. The parallel-connected diodes therefore provide a current path to ground to dissipate the electrical feedback, while the series-connected diodes block any reverse current flow back to the input. The series and parallel-connected diodes may include Zener diodes, Schottky diodes, other equivalent semiconductor components, or other components capable of similar function. The circuit board is protected in a housing that includes mounting holes or mounting features so that it can be fixed in a desired location. A portion of the housing may be removable to access the circuit board for inspection and to ensure that the proper input, output and ground connections are made.

In another aspect, an inventive hazardous environment electrical equipment assembly is provided wherein an electrical feedback barrier and a non-intrinsically safe electrical load device are each provided in an explosion-proof enclosure, while an intrinsically safe power supply is remotely located and connected to the electrical feedback barrier via wiring or cabling. The electrical feedback barrier is mounted stationary inside the explosion-proof enclosure such that electrical feedback from the non-intrinsically safe load device is safely contained within the explosion-proof enclosure. The electrical feedback barrier is connected to earth ground through the explosion-proof enclosure and is operative to isolate the intrinsically safe power supply from the non-intrinsically safe load device and prevent electrical feedback from reaching the intrinsically safe power supply by shunting the electrical feedback to earth ground. The non-intrinsically safe load device may be a CCTV camera, a sensor, an instrumentation component, a monitoring component, or another low power consumption device.

In another aspect, an inventive electrical power system is provided that includes at least one intrinsically safe power supply and a plurality of non-intrinsically safe electrical load devices powered by the intrinsically safe power supply. A plurality of electrical feedback barriers is provided to respectively interconnect the intrinsically safe power supply and each one of the plurality of non-intrinsically safe electrical load devices. Each electrical feedback barrier is operative to protect the intrinsically safe power supply from electrical feedback produced by the respective non-intrinsically safe electrical load device to which it is connected. Any electrical feedback is shunted to earth ground by the electrical feedback barrier so that the operation of the intrinsically safe power supply is not compromised.

In another aspect, an inventive method of powering a non-intrinsically safe electrical load device from an intrinsically safe power supply has also been disclosed. The method includes providing an electrical feedback barrier configured to protect the intrinsically safe power supply from electrical feedback produced by the non-intrinsically safe electrical load device, connecting an input of the electrical feedback barrier to the intrinsically safe power supply, connecting an output of the electrical feedback barrier to the non-intrinsically safe electrical load device, and connecting the electrical feedback to earth ground, wherein any electrical feedback to the output of the electrical barrier is shunted to earth ground to protect the intrinsically safe power supply. The method may also include mounting the feedback barrier within a flameproof enclosure and connecting the electrical feedback to earth ground through the flameproof enclosure.

The significant benefit of the inventive concepts will now be explained in reference to the exemplary embodiments illustrated in the Figures. Method aspects will be in part apparent and in part explicitly discussed in the following description.

FIG. 1 is a block diagram of an electrical power system 100 including an intrinsically safe (IS) power supply 102 connected to a non-intrinsically safe (non-IS) electrical load device 104 through an exemplary electrical feedback barrier device 106.

As used herein, the IS power supply 102 conforms to and complies with applicable standards for certification as an "intrinsically safe" device. Accordingly, the IS power supply 102 includes thermal and electrical energy limiting features that maintain a voltage and current output from the IS power supply below a predetermined limit. Suitable IS power supply devices are commercially available from various manufacturers such as, for example only, MTL products of Eaton's Crouse Hinds Business (www.mtl-inst.com/products). The IS power supply 102 may include electronic barrier and isolation features such as Zener barriers and the like to ensure that the energy provided at the power output from the IS power supply is appropriately limited to ensure the desired intrinsically safe operation.

The non-IS electrical load device 104, in contrast to the IS power supply 102, neither conforms to nor complies with applicable standards for certification as an "intrinsically safe" device. The non-IS electrical load device 104 does not itself include a power supply, and therefore requires a power supply such as the IS power supply 102 in order to operate. The non-IS electrical load device 104 includes capacitive and/or inductive circuitry that may in some instances return thermal and electrical energy back to its power input as electrical feedback.

The electrical barrier feedback device 106 is therefore provided to respond to any electrical feedback generated by the non-IS electrical load device 104 and isolate the electrical feedback from the IS power supply 102. The electrical barrier feedback device 106 is configured to dissipate the electrical feedback energy to earth ground and prevent it from reaching the IS power supply 102. In order to do so, the output of the IS power supply 102 is connected to an input of the electrical barrier feedback device 106, an output of the electrical barrier feedback device 106 is connected to the input of the non-IS electrical load device 104, and a connection to earth ground is established through the electrical barrier feedback device 106. The connections to and from the electrical barrier feedback device 106 may be established by lead wires or cables, or in any other manner desired.

In contemplated embodiments, the IS power supply 102 may be remotely located at a distance from the electrical barrier feedback device 106 while the electrical barrier feedback device 106 and the non-IS electrical load device 104 are at approximately the same location. In view of a hazardous ambient environment 108, the non-IS electrical load device 104 and the electrical barrier feedback device 106 are enclosed in an Explosion-Proof or Flame-Proof enclosure 110 that conforms to and complies with applicable standards for electrical equipment in a hazardous environment such as, for example, a Group 1 mining application.

Specifically, in a contemplated embodiment the enclosure 110 is a normal Group I, Zone 1 certified Ex d enclosure that has been tested to meet the requirements defined in EN/IEC 60079-0 (general requirements) and in EN/IEC 60079-1 for the "flameproof" (pressure-tight encapsulation) type of ignition protection. The electrical barrier feedback device 106 is securely mounted in the Ex d enclosure 110 to prevent its movement. Appropriate care must be taken when terminating the connections to the IS power supply 102 and the non-IS electrical load device 104 to ensure that the IS and non-IS connections are kept separate at all times. If the connections to the power supply 102 and the load device 104 are made on a common terminal strip, then all barriers and segregation gaps as per IEC 60079 shall be maintained. The connection to earth ground may be made through the Ex d disclosure 110.

In other contemplated embodiments, an Ex d enclosure 110 of the type described above may not be required, and instead another type of enclosure such as an explosion protected (Ex e) enclosure as defined in applicable standards may instead be utilized as desired. Further, in some cases the ambient environment 108 may not necessarily be hazardous at all such that the enclosure 110 need not necessarily be Ex d or Ex e compliant.

Figure 2:
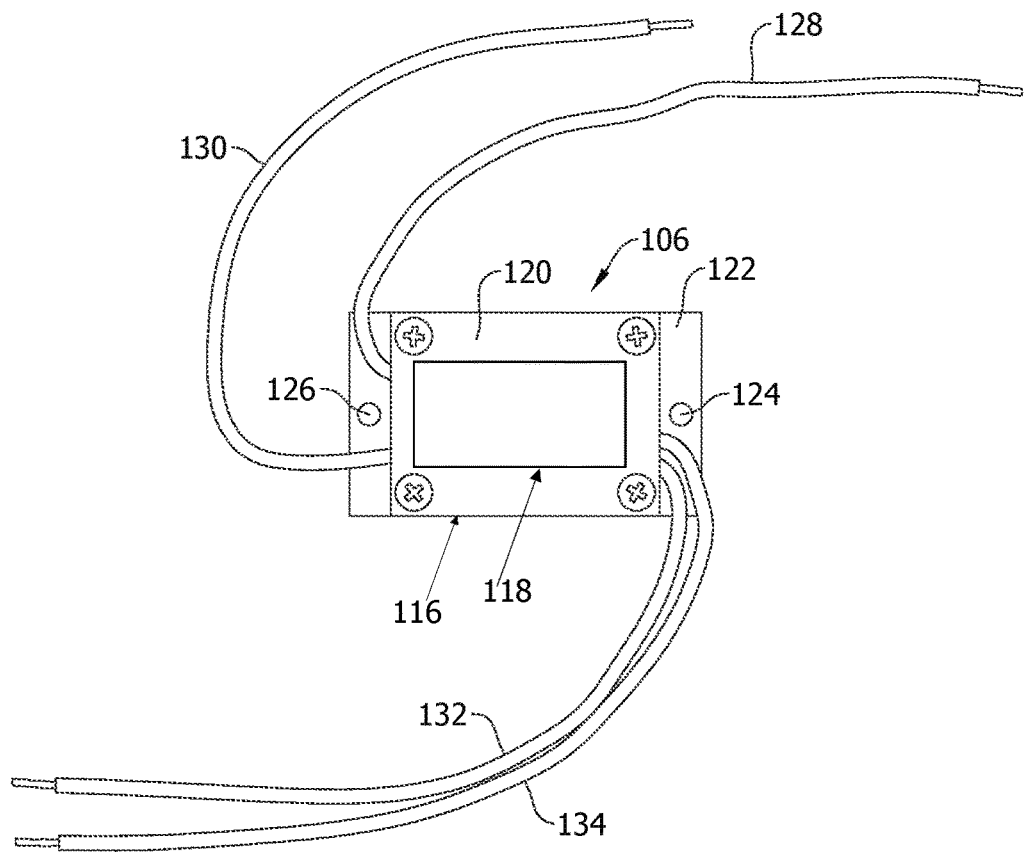
FIG. 2 is a top view of the electrical feedback barrier shown in FIG. 1.

FIG. 2 is a top view of the electrical feedback barrier 106. The electrical feedback barrier 106 includes a printed circuit board that is fitted within upper and lower protective polycarbonate cover elements 120, 122 that collectively provide IP20 protection of the circuit board from other circuit elements within the flameproof enclosure 110. The upper cover 120 of the electrical feedback barrier 106 is removable via fasteners as shown to provide access to the circuit board. The lower cover 122 of the electrical feedback barrier 106 includes mounting apertures 124, 126 or other mounting features so that the electrical feedback barrier 106 may be fixed and secured stationary at a desired location within the enclosure 110.

The circuit board in the electrical feedback barrier 106 is marked with indicia for reference by the installer when the upper cover element 120 is removed so that the proper connections to the IS power supply 102, the non-IS electrical load device 104, and to earth ground may be made. The electrical feedback barrier 106 further includes wire leads that are pre-attached to the electrical feedback barrier 106 to facilitate the necessary connections to the IS power supply 102, The wire leads are likewise marked with labels to ensure proper installation. In the example shown, the leads include an input wire lead 128 to establish electrical connection to the IS power supply 102, an output wire lead 130 to establish electrical connection to the non-IS electrical load device 104, and a pair or earth leads 132, 134 to establish connection to earth ground.

Figure 3:
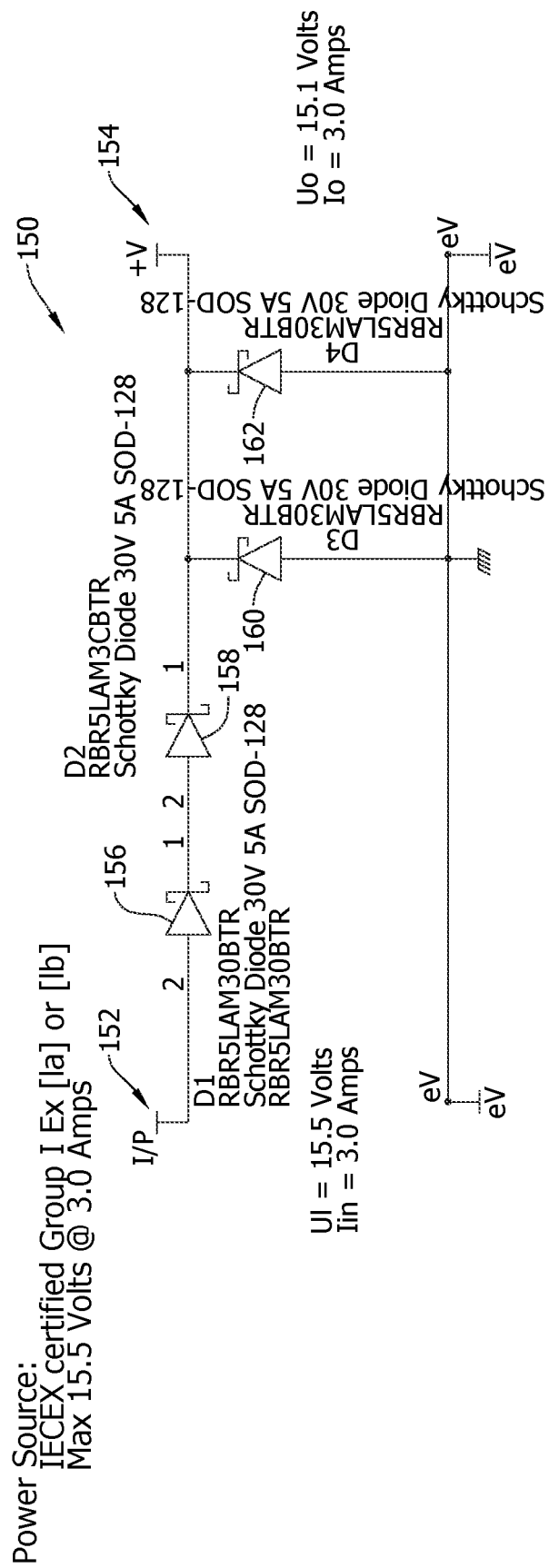
FIG. 3 is a circuit schematic of the electrical feedback barrier shown in FIG. 2.

FIG. 3 is an exemplary circuit schematic of the electrical feedback barrier 106 illustrating the circuitry 150 implemented on the circuit board of the electrical feedback barrier 106. The circuitry 150 includes an input 152, an output 154, a pair of active elements in the series-connected diodes 156, 158 connected between the input 152 and the output 154, and a pair of active elements in the form of parallel-connected diodes 160, 162 respectively connected to earth ground. The diodes 156, 158 and 160, 162 are provided in pairs to provide desirable redundancy in the operation of the electrical feedback barrier 106 and enhanced safety in the hazardous environment 108. In alternative embodiments, however, greater or fewer numbers of diodes may be employed.

The input 152 of the circuitry 150 connects to the IS power supply 102 and receives the energy limited power output (voltage and current) from the IS power supply 102. The output 154 of the circuitry 150 connects to the non-IS electrical load device 104. In normal operation, when electrical feedback is not produced by the non-IS electrical load device 104, the parallel-connected diodes 160, 162 are non-conductive while the series-connected diodes 156, 158 are conductive. Therefore, in normal operation the voltage and current at the input 152 is passed through the series-connected diodes 156, 158 from the input 152 to the output 154. The diodes 156, 158, 160, 162 are therefore selected to carry the energy limited output of the IS power supply 102, without themselves limiting the energy provided at the output 154. That is in normal operation the circuitry 150 passes through the limited energy supplied by the IS power supply to the non-IS electrical load device 104, but the circuitry 150 itself has no energy limiting function that operates independently from the IS power supply 102.

In one contemplated example, the IS power supply outputs 15.5V and 3.0 A to the input 152 of the circuitry 150, and the circuitry 150 outputs 15.1 V and 3.0 A to the output 154 and therefore to the non-IS electrical load device 104. The series-connected diodes 156, 158 therefore conduct all of the current in the forward direction from the input 152 to the output 154 in normal operation, while only slightly reducing the voltage at the output 154 due the voltage drop of the diodes 156, 158 in operation. The voltage output of the circuitry 150 in this example is sufficient, however, to power a low power consumption non-IS electrical load device 104 such as a CCTV camera device.

When electrical feedback energy is generated by the non-IS electrical load device 104, the feedback energy causes a voltage increase at the output 154 of the feedback barrier 106 such that the voltage at the output 154 rises above the normal output voltage passed through the circuitry 150. If not addressed, such a voltage increase at the output 154 could cause a reverse current to flow from the output 154 to the input 152 of the circuitry and return energy back to the IS power supply 102, possibly causing the IS power supply 102 to assume an operating state that is no longer intrinsically safe. Accordingly, when electrical feedback from the non-IS load device 104 is present at the output 154 of the circuitry 150 in the feedback barrier 106, the increased voltage at the output 154 causes a breakdown in the parallel-connected diodes 160, 162 that in turn provides a shunt current path from the output 154 to earth ground, while the series-connected diodes 156, 158 remain operative to continue to conduct the forward current from the input 152 but block any reverse current flow.

The combined action of the series and parallel-connected diodes 156, 158, 160, 162 in the circuitry 150 therefore provide an energy barrier that isolates the IS power supply 102 from the non-IS electrical load device 104 when needed, and therefore protects the IS power supply 102 from electrical feedback of the non-IS electrical load device 104. As such, the IS power supply 102 continues to operate in an intrinsically safe manner at all times while powering the non-IS electrical load device 104. The feedback barrier 106 in the example shown and described implements Ex i (intrinsic safety) installation parameters of maximum $U_i$ 15.5 V, $I_i$ 3.0 A, $C_i$ 0 uF, $L_i$ 0 uH, and complies with the standards of IEC 60079-0 and IEC 60079-11. Variations are possible, however, in further and/or alternative embodiments.

The diodes 156, 158, 160, 162 in various contemplated embodiments may be active semiconductor components such as Zener diodes, Schottky diodes or other components capable of similar function in the circuitry 150 as described above. As the construction and operation of such active components is well known and understood, further description of the structure and operation thereof is believed to be unnecessary. The diodes 156, 158, 160, 162 in the circuitry 150 are voltage dependent components operable in a known manner to respectively conduct current in the forward direction when connected to the IS power supply 102 to allow energy limited voltage and current output to the non-IS load device 104 through the circuitry 150, block current flow in the reverse direction from the non-IS load device 104 to the IS power supply 102, and breakdown to provide a current path to electrical ground in the circuitry 150 and safely dissipate any excess voltage at the output of the circuitry 150. By strategically selecting active components with the desired voltage characteristics, different input and output voltages can be accommodated by the circuitry 150 while actively responding to electrical feedback energy produced by the non-IS electrical load device 104 to ensure safe operation in the hazardous environment. The active components 156, 158, 160, 162 may be the same or different from one another in various different embodiments to provide different effects as desired.

The circuitry 150 may also include additional active or passive circuit components as desired. The circuitry 150 is one example of a circuit capable of functioning as described above, while similar functionality could be provided with alternative circuitry in the electrical feedback barrier 106 as desired. The circuitry 150 may be fabricated on a printed circuit board and enclosed with the cover elements 120, 122 as shown in FIG. 2.

Figure 4:
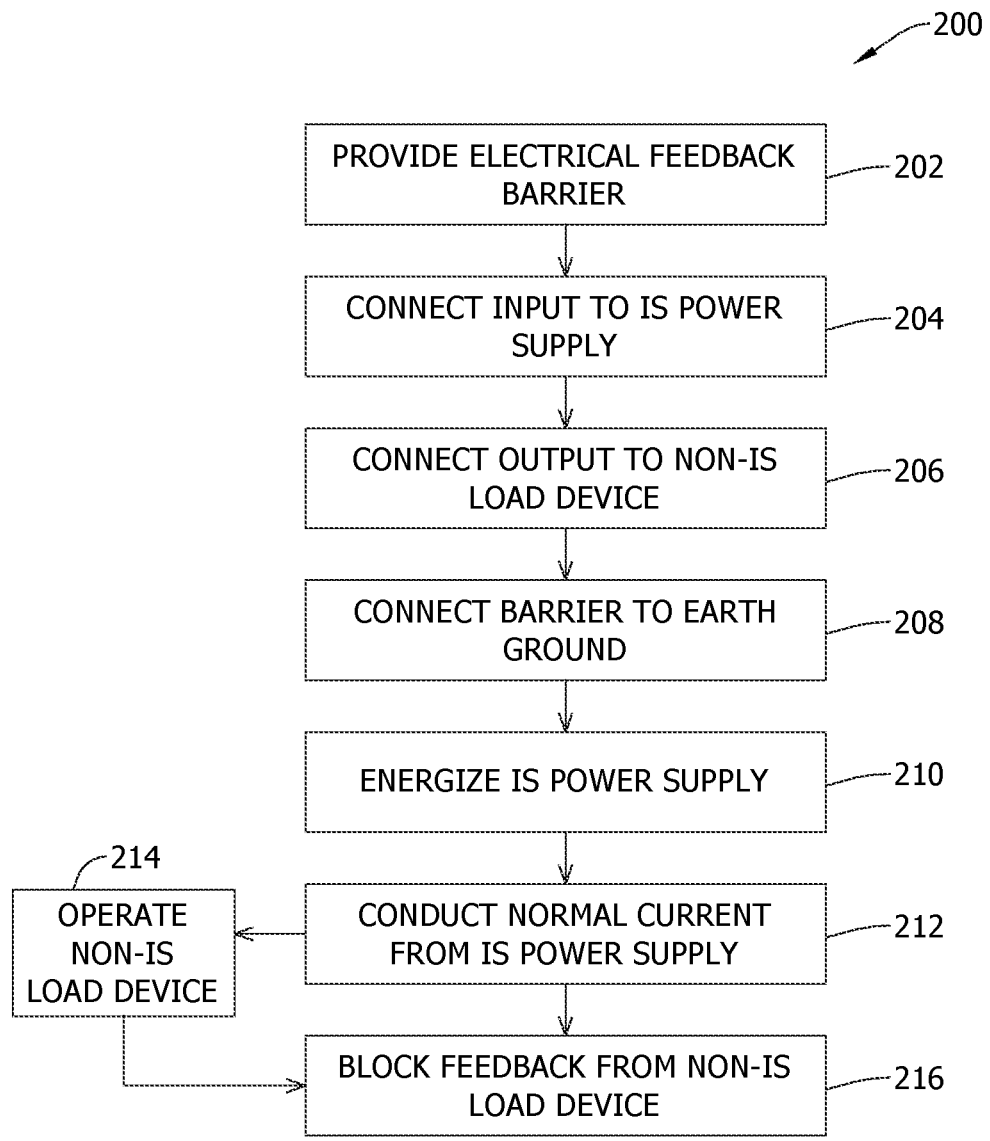
FIG. 4 is a method flowchart for the installation and operation of the electrical feedback barrier shown in FIG. 3.

FIG. 4 is a flowchart of a method 200 for the installation and operation of the electrical feedback barrier 104 which may include the circuitry 150 shown in FIG. 3.

At step 202, the electrical feedback barrier is provided. For the purposes of step 202, the provision of feedback barrier may include directly or indirectly obtaining the feedback barrier from the manufacturer via purchase of the feedback barrier from the manufacturer or an authorized distributor of the manufacture. In some cases, however, the step 202 of providing the feedback barrier may include the actual manufacture of the barrier device including circuitry such as that described above.

At steps 204, 206 and 208 the feedback barrier is connected to the IS power supply, to the non-IS load device, and to earth ground. Such connections may be made via pre-attached lead wires of the feedback barrier as described above. Such pre-attached lead wires may be soldered to the circuit board in the feedback barrier on end, and the respective distal ends of the lead wires may be connected via known terminals or connectors that may be separately provided. Alternatively, the connections at steps 204, 206 and 208 may be made via separately provided wires and cabling that is not pre-attached to the feedback barrier, and in such cases terminals may be supplied on the feedback barrier for making such connections tow wires or cabling. Likewise, connectors may also be provided on or with the feedback barrier or may be separately supplied to make the needed connections at steps 204, 206 and 208. Generally speaking, as long as each connection is securely established, the connections may be established in any known manner. Proper care should be taken to avoid loose connections.

In different embodiments, the connections made at steps 204, 206 and 208 may be made by the same or different persons as the person (or persons) involved at step 202. Once the connections are made, the IS-power supply is energized at step 210 to complete the installation thereof. Steps 202, 204, 206 and 210 are preparatory to the operation of the feedback barrier. Also, as step of enclosing the feedback barrier and non-IS load device is not shown in FIG. 4, but is assumed as a hazardous location would generally require an Ex d enclosure or another certified type of enclosure as discussed above.

At step 212, the feedback barrier conducts normal, energy limited current in a forward direction from the IS power supply and passes it to the non-IS load device. The energy limited voltage/current powers the non-IS load device at step 214 for operation thereof. In one example, the non-IS load device may be a CCTV camera device.

At step 216, the feedback barrier blocks electrical feedback energy generated by the feedback device in the reverse direction, and any build-up of electrical feedback energy on the feedback barrier is diverted to earth ground. By virtue of step 216, the IS power supply is therefore isolated from the non-IS load device generally, and specifically is isolated from electrical feedback specification that is generated by the non-IS load device. The IS power supply cannot be impacted by electrical feedback of the non-IS load device, and the IS power supply may therefore safely to power the non-IS load device at all time.

As such, steps 212, 214 and 216 may occur simultaneously when feedback is present. In the absence of electrical feedback from the load device, however, only steps 212 and 214 will occur. Step 216 will automatically cycle on and off to block electrical feedback only when it is actually needed.

While an exemplary method 200 has been described, variations are possible. Certain steps may be omitted or combined in other embodiments, and additional steps may be added to realize similar effects and benefits, as well as certain steps may be re-ordered and performed in a different sequence to that shown and described.

Figure 5:
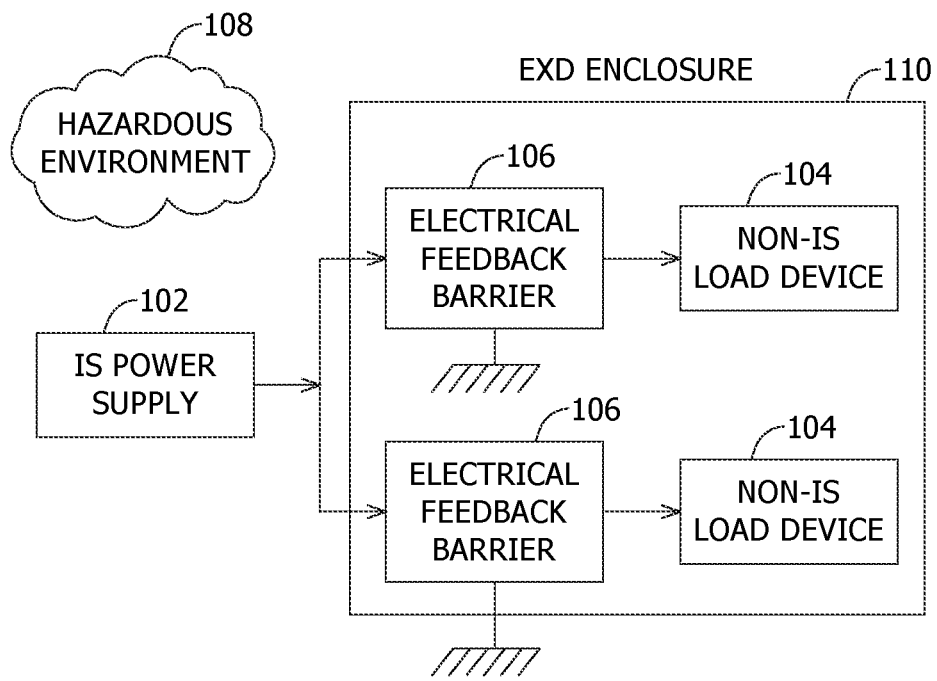
FIG. 5 is a second block diagram of an electrical power system including electrical feedback barriers according to an exemplary embodiment of the invention.
Figure 6:
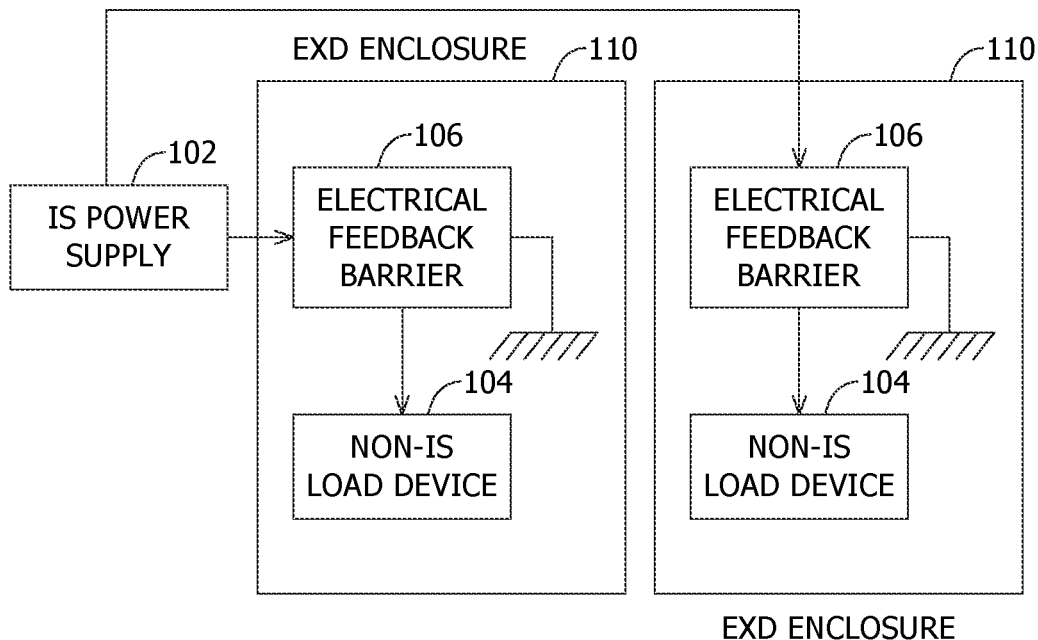
FIG. 6 is a third block diagram of an electrical power system including electrical feedback barriers according to an exemplary embodiment of the invention.

As shown in FIGS. 5 and 6, in additional contemplated embodiments, the feedback barrier 106 including the circuitry 150 is provided in a one-to-one relation with each non-IS electrical load device 104 that is to be isolated from an IS power supply 102. While one IS power supply 102 is shown in FIGS. 1, 5, and 6, it is recognized that multiple IS power supplies 102 may be present on site in any given power system. Multiple non-IS electrical load devices 104 may be connected to the same IS power supply 102 in the same enclosure 110 (FIG. 5) or in different enclosures 100 (FIG. 6), but each non-IS electrical load device 104 should be connected through a feedback barrier 106 to ensure the integrity of the connected IS power supply 102. Otherwise, feedback effects could accumulate from multiple non-IS electrical load devices 104 and provide severe consequences to the IS power supply 102.

In the example of a CCTV system, a number of low power non-IS CCTV devices may be dispersed in various different locations and may be housed in separate enclosures at respective different locations as shown in FIG. 6, but still powered by the same IS power supply. As need or as desired, however, low power non-IS CCTV devices may be powered separately or in combination by different IS power supplies in the same or different location from one another.

For other types of low power non-IS load devices that are operable in the same location, such low power non-IS load devices and feedback barriers 106 may be housed in the same enclosure as shown in FIG. 5, or in different enclosures in approximately the same area or location. In a single enclosure embodiment of FIG. 5 that houses multiple low power non-IS load devices 104 and feedback barriers 106, appropriate spacing between the low power non-IS load devices 104 in the enclosure should be observed to avoid any accumulated feedback energy effects.

In some embodiments, power supplies 102, feedback barriers 104 and/or enclosures 110 could be provided in kit form that facilitates convenient installation for a specific power system operating in a hazardous location. Modular part systems could be manufactured and inventoried for ease of assembly and installation in the field. For example, an IS power supply 102 may be provided to an installer with a compatible feedback barrier 106, a feedback barrier 106 could be provided with a compatible enclosure 110, etc. The IS power supply 102, feedback barriers 104 and enclosures could be color coded or provided with other indicia to provide further assurances to installers that compatible equipment is being installed and connected.

The benefits and advantages of the inventive concepts are now believed to have been demonstrated in the exemplary embodiments disclosed.

An embodiment of an electrical feedback barrier device for a non-intrinsically safe electrical load device in a hazardous environment has been disclosed. The electrical feedback barrier device includes an input and a first lead wire to establish connection to an intrinsically safe power supply in the hazardous environment, an output and a second lead wire to establish connection to the non-intrinsically safe electrical load device in the hazardous environment, at least a third lead wire to establish connection to electrical ground, and feedback barrier circuitry interconnecting the input and the output. In normal operation, the feedback barrier circuitry is operative to pass through an energy limited output voltage and current from the intrinsically safe power supply connected to the input to the non-intrinsically safe electrical load device connected to the output. When electrical feedback energy from capacitive or inductive elements in the non-intrinsically safe electrical load device is presented to the output of the feedback barrier circuitry, the feedback barrier circuitry is operative to provide a shunt current path to divert the electrical feedback energy to electrical ground via the third lead wire, thereby preventing the electrical feedback energy from reaching the input and possibly causing an unsafe operation of the connected intrinsically safe power supply in the hazardous environment.

Optionally, the feedback barrier circuitry includes a plurality of active elements operable in combination to isolate any electrical feedback presented on the output from the input. The plurality of active elements may be Zener diodes or Schottky diodes.

The electrical feedback barrier device may also include a circuit board, with the feedback barrier circuitry being defined on the circuit board. The circuit board may define the input and the output, and a number of diodes may be connected between the input and the output on the circuit board. The number of diodes may include a series-connected pair of diodes and a pair of parallel-connected diodes. The series-connected pair of diodes may conduct current in a forward direction from the input to the output in normal operation, while the parallel-connected pair of diodes in normal operation do not conduct any current. The parallel-connected diodes may be responsive to an increased voltage at the output that is produced by electrical feedback from the non-intrinsically safe load device, thereby providing a current path to ground to dissipate the electrical feedback while the series-connected diodes block any reverse current flow back toward the input.

The electrical feedback barrier device may also include a housing, with the circuit board being protected in the housing, and the housing being configured to fix the circuit board in a desired location. A portion of the housing may be removable to access the circuit board for inspection of input, output and ground terminals to ensure that proper connections thereto are made.

An embodiment of an electrical power system for a hazardous environment has been disclosed including an explosion-proof or flameproof enclosure, and an electrical feedback barrier and a non-intrinsically safe electrical load device each provided in the explosion-proof enclosure and being electrically connected to one another. The electrical feedback barrier is operative to isolate electrical feedback from the non-intrinsically safe electrical load device from reaching an intrinsically safe power supply remotely located from but connected to the electrical feedback barrier, thereby preventing an unsafe operation of the intrinsically safe power supply in the hazardous environment.

Optionally, the electrical feedback barrier may be mounted stationary inside the explosion-proof or flameproof enclosure, whereby electrical feedback from the at least one non-intrinsically safe load device is safely contained within the explosion-proof or flameproof enclosure. The electrical feedback barrier may be connected to earth ground through the explosion-proof or flameproof enclosure and is operative to isolate the intrinsically safe power supply from the at least one non-intrinsically safe load device and prevent electrical feedback from reaching the at least one intrinsically safe power supply by shunting the electrical feedback to earth ground. The at least one non-intrinsically safe load device may be a low power consumption device selected from the group of a closed circuit television (CCTV) camera, a sensor, an instrumentation component, and a monitoring component.

As further options, the electrical feedback barrier may include series-connected active elements conducting forward current from the intrinsically safe power supply to the non-intrinsically safe load device and preventing reverse current flow from the non-intrinsically safe load device to the intrinsically safe power supply, and parallel-connected active elements operative to shunt electrical feedback to electrical ground when electrical feedback generated by capacitive or inductive elements in the non-intrinsically safe electrical load device is presented on the electrical feedback barrier. The series-connected active elements and the parallel-connected active elements may be Zener diodes or Schottky diodes.

A method of safely powering a non-intrinsically safe electrical load device from an intrinsically safe power supply in a hazardous environment has also been disclosed. The method is implemented with an electrical feedback barrier configured to protect the intrinsically safe power supply from electrical feedback produced by the non-intrinsically safe electrical load device. The electrical feedback barrier includes an input connected to the intrinsically safe power supply in the hazardous environment, an output connected to the non-intrinsically safe electrical load device in the hazardous environment, and a connection to earth ground. The method includes passing an energy limited current and voltage from the intrinsically safe power supply through the electrical feedback barrier to the non-intrinsically safe electrical load device, and shunting, via the feedback barrier, electrical feedback generated in the operation of the non-intrinsically safe electrical load device to electrical ground in order to protect the intrinsically safe power supply from reaching an unsafe condition in the hazardous environment.

Optionally, the method may further include mounting the feedback barrier and the non-intrinsically safe electrical load device within an explosion-proof or flameproof enclosure. Likewise, the method may include selecting a low power consumption intrinsically safe electrical load device from the group consisting of a closed circuit television (CCTV) camera, a sensor, an instrumentation component, and a monitoring component. Passing of the energy limited current and voltage from the intrinsically safe power supply through the electrical feedback barrier to the non-intrinsically safe electrical load device may include operating a pair of series-connected diodes connected between the input and output of the electrical feedback barrier. Shunting, via the feedback barrier, electrical feedback generated in the operation of the non-intrinsically safe electrical load device to electrical ground in order to protect the intrinsically safe power supply from reaching an unsafe condition in the hazardous environment may include operating a pair of parallel-connected diodes connected to the output, with the operation of the pair of parallel-connected diodes being responsive to a voltage increase on the output to divert electrical feedback energy to earth ground.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical power system for a hazardous environment comprising:
   an explosion-proof or flameproof enclosure;

an electrical feedback barrier and a non-intrinsically safe electrical load device each provided in the explosion-proof enclosure and being electrically connected to one another; and wherein the electrical feedback barrier is operative to isolate electrical feedback from the non-intrinsically safe electrical load device from reaching an intrinsically safe power supply remotely located from but connected to the electrical feedback barrier, thereby preventing an unsafe operation of the intrinsically safe power supply in the hazardous environment; and wherein the electrical feedback barrier is connected to earth ground through the explosion-proof or flameproof enclosure and is operative to isolate the intrinsically safe power supply from the non-intrinsically safe load device and prevent electrical feedback from reaching the intrinsically safe power supply by shunting the electrical feedback to the earth ground.

2. The electrical power system of claim 1, wherein the electrical feedback barrier is mounted stationary inside the explosion-proof or flameproof enclosure, whereby electrical feedback from the non-intrinsically safe load device is safely contained within the explosion-proof or flameproof enclosure.

3. The electrical power system of claim 1, wherein the non-intrinsically safe load device is a low power consumption device selected from the group of a closed circuit television (CCTV) camera, a sensor, an instrumentation component, and a monitoring component.

4. The electrical power system of claim 1, wherein the electrical feedback barrier comprises:

series-connected active elements conducting forward current from the intrinsically safe power supply to the non-intrinsically safe load device and preventing reverse current flow from the non-intrinsically safe load device to the intrinsically safe power supply; and parallel-connected active elements operative to shunt electrical feedback to the electrical ground when electrical feedback generated by capacitive or inductive elements in the non-intrinsically safe electrical load device is presented on the electrical feedback barrier.

5. The electrical power system of claim 4, wherein the series-connected active elements and the parallel-connected active elements are Zener diodes or Schottky diodes.

6. A method of safely powering a non-intrinsically safe electrical load device from an intrinsically safe power supply in a hazardous environment, the method implemented with an electrical feedback barrier configured to protect the intrinsically safe power supply from electrical feedback produced by the non-intrinsically safe electrical load device;

wherein the electrical feedback barrier comprises an input connected to the intrinsically safe power supply in the hazardous environment, an output connected to the non-intrinsically safe electrical load device in the hazardous environment, and a connection to earth ground; the method comprising:

passing an energy limited current and voltage from the intrinsically safe power supply through the electrical feedback barrier to the non-intrinsically safe electrical load device; and shunting, via the feedback barrier, electrical feedback generated in the operation of the non-intrinsically safe electrical load device to the earth ground in order to protect the intrinsically safe power supply from reaching an unsafe condition in the hazardous environment, wherein the electrical feedback barrier is connected to the earth ground through an explosion-proof or flameproof enclosure and is operative to isolate the intrinsically safe power supply from the non-intrinsically safe load device and prevent electrical feedback from reaching the intrinsically safe power supply by shunting the electrical feedback to the earth ground.

7. The method of claim 6, further comprising mounting the feedback barrier and the non-intrinsically safe electrical load device within the explosion-proof or flameproof enclosure.

8. The method of claim 6, further comprising selecting the non-intrinsically safe electrical load device from the group consisting of a closed circuit television (CCTV) camera, a sensor, an instrumentation component, and a monitoring component.

9. The method of claim 6, wherein passing an energy limited current and voltage from the intrinsically safe power supply through the electrical feedback barrier to the non-intrinsically safe electrical load device comprises operating a pair of series-connected diodes connected between the input and output of the electrical feedback barrier.

10. The method of claim 9, wherein shunting, via the feedback barrier, electrical feedback generated in the operation of the non-intrinsically safe electrical load device to the earth ground in order to protect the intrinsically safe power supply from reaching an unsafe condition in the hazardous environment comprises operating a pair of parallel-connected diodes connected to the output, the operation of the pair of parallel-connected diodes being responsive to a voltage increase on the output to divert electrical feedback energy to the earth ground.

11. A method of safely powering a non-intrinsically safe electrical load device from an intrinsically safe power supply in a hazardous environment, the intrinsically safe power supply being remotely located from the non-intrinsically safe electrical load device and connected to an electrical feedback barrier, the electrical feedback barrier configured to protect the intrinsically safe power supply from electrical feedback produced by the non-intrinsically safe electrical load device;

wherein the electrical feedback barrier comprises an input connected to the intrinsically safe power supply in the hazardous environment, an output connected to the non-intrinsically safe electrical load device in the hazardous environment, and a connection to earth ground; the method comprising:

passing an energy limited current and voltage from the intrinsically safe power supply through the electrical feedback barrier to the non-intrinsically safe electrical load device; and shunting, via the feedback barrier, electrical feedback generated in the operation of the non-intrinsically safe electrical load device to electrical ground in order to protect the intrinsically safe power supply from reaching an unsafe condition in the hazardous environment, wherein the electrical feedback barrier is connected to the earth ground through the explosion-proof or flameproof enclosure and is operative to isolate the intrinsically safe power supply from the non-intrinsically safe load device and prevent electrical feedback from reaching the intrinsically safe power supply by shunting the electrical feedback to the earth ground.

12. The method of claim 11, further comprising mounting the feedback barrier and the non-intrinsically safe electrical load device within the explosion-proof or flameproof enclosure.

13. The method of claim 11, further comprising selecting the non-intrinsically safe electrical load device from the group consisting of a closed circuit television (CCTV) camera, a sensor, an instrumentation component, and a monitoring component.

14. The method of claim 11, wherein passing an energy limited current and voltage from the intrinsically safe power supply through the electrical feedback barrier to the non-intrinsically safe electrical load device comprises operating a pair of series-connected diodes connected between the input and output of the electrical feedback barrier.

15. The method of claim 11, wherein shunting, via the feedback barrier, electrical feedback generated in the operation of the non-intrinsically safe electrical load device to the earth ground in order to protect the intrinsically safe power supply from reaching an unsafe condition in the hazardous environment comprises operating a pair of parallel-connected diodes connected to the output, the operation of the pair of parallel-connected diodes being responsive to a voltage increase on the output to divert electrical feedback energy to the earth ground.

* * * * *